(12) United States Patent
Smyth et al.

(10) Patent No.: US 11,513,005 B2
(45) Date of Patent: Nov. 29, 2022

(54) DEVICE AND METHOD FOR OPTICAL SPECTRUM MEASUREMENT

(71) Applicant: Pilot Photonics Ltd., Dublin (IE)

(72) Inventors: Frank Smyth, Dublin (IE); Jules Braddell, Dublin (IE)

(73) Assignee: PILOT PHOTONICS LTD.

( * ) Notice: Subject to any disclaimer, the term of this patent is extended or adjusted under 35 U.S.C. 154(b) by 18 days.

(21) Appl. No.: 16/956,777

(22) PCT Filed: Dec. 21, 2018

(86) PCT No.: PCT/EP2018/086679
§ 371 (c)(1),
(2) Date: Jun. 22, 2020

(87) PCT Pub. No.: WO2019/122369
PCT Pub. Date: Jun. 27, 2019

(65) Prior Publication Data
US 2020/0319029 A1    Oct. 8, 2020

(30) Foreign Application Priority Data

Dec. 22, 2017 (GB) .................................. 1721753

(51) Int. Cl.
| | |
|---|---|
| *G01N 21/00* | (2006.01) |
| *G01J 3/42* | (2006.01) |
| *G01J 3/02* | (2006.01) |
| *G01J 3/10* | (2006.01) |
| *H01S 5/00* | (2006.01) |

(Continued)

(52) U.S. Cl.
CPC .............. *G01J 3/42* (2013.01); *G01J 3/0218* (2013.01); *G01J 3/10* (2013.01); *H01S 5/0078* (2013.01); *H01S 5/0687* (2013.01); *H01S 5/12* (2013.01); *H01S 5/4012* (2013.01); *H01S 5/4087* (2013.01); *G01J 2003/106* (2013.01); *G01J 2003/423* (2013.01)

(58) Field of Classification Search
CPC .. G01N 21/39; G01N 21/3504; G01N 21/031; G01N 2021/399; G01J 3/42
USPC ......................................................... 356/437
See application file for complete search history.

(56) References Cited

U.S. PATENT DOCUMENTS

| | | | |
|---|---|---|---|
| 2002/0131104 A1* | 9/2002 | Johnson | H04B 10/077 398/34 |
| 2015/0159990 A1 | 6/2015 | Plusquellic et al. | |
| 2017/0025690 A1 | 9/2017 | Braddell et al. | |

OTHER PUBLICATIONS

Sho Okubo et al, "Near-infrared broadband dual-frequency-comb spectroscopy with a resolution beyond the Fourier limit determined by the observation time window", Optics Express, vol. 23, No. 26, Dec. 16, 2015 (Dec. 16, 2015), 10 pages.

(Continued)

*Primary Examiner* — Md M Rahman
(74) *Attorney, Agent, or Firm* — K&L Gates LLP

(57) ABSTRACT

A device for measuring optical spectra at high speed and with high resolution using tunable optical laser comb sources. In one embodiment there is provided a first tunable comb laser source and a second tunable comb laser source whereby the wavelength of each comb laser source is chosen such that the combination of the two sources provides a continuous spectral coverage over a band in an optical spectrum under a selected wavelength tuning condition. By overlapping the two comb sources in the manner described the deadzone issue is overcome in the most spectrally efficient way possible.

14 Claims, 6 Drawing Sheets

(51) Int. Cl.
H01S 5/0687 (2006.01)
H01S 5/12 (2021.01)
H01S 5/40 (2006.01)

(56) References Cited

OTHER PUBLICATIONS

International Search Report and Written Opinion for International application No. PCT/EP2018/086679, mailed from the International Searching Authority dated May 9, 2019 (16 pages).

* cited by examiner

DEVICE AND METHOD FOR OPTICAL SPECTRUM MEASUREMENT

CROSS REFERENCE TO RELATED APPLICATIONS

This is the national phase under 35 U.S.C. § 371 of International Application No. PCT/EP2018/086679, filed on Dec. 21, 2018, which claims priority to and the benefit of Great Britain Patent Application No. 1721753.0 filed on Dec. 22, 2017, the entire disclosures of each of which are incorporated by reference herein.

BACKGROUND

The present disclosure is in the technical field of photonics. More particularly, the present disclosure is in the technical field of Optical Test and Measurement. More particularly, the present disclosure the in the technical field of Optical Sensors and Devices.

Measuring optical spectrum signals is useful for a variety of applications such as optical sensor deployment, optical component testing and it is also useful in the research and development of new optical systems for optical transmission systems, measurement systems and sensor applications. To measure the spectrum at a high resolution requires some type of filter or method that can distinguish very narrow slices of the spectrum and measure the power in that slice. This is a technically challenging and problematic task. There is normally a trade-off between the resolution achievable, the cost of the chosen solution, the speed at which it works and the ruggedness of the measurement tool.

Traditional light sources for spectral analysis include broadband light sources (such as superluminescent LEDs) and narrowband light source (such as lasers). Broadband light sources offer good spectral coverage, but with poor resolution. Narrowband light sources offer higher resolution but over a much narrower spectral band. Typically narrowband sources are used in swept-mode in order to cover a broader spectral range with high resolution. This results in a slower spectral measurement.

Optical frequency combs are a useful technology for optical spectral analysis because they combine the best properties of the aforementioned light sources. A broad spectral comb, of narrow-band signals.

Optical comb sources that are based on a physical cavity, for example mode locked lasers, exhibit a spacing between the wavelengths that is largely fixed. This limits the resolution that they can offer in spectrum analysis applications.

Other comb sources, such as gain switched comb sources, and electro-optical modulator based comb sources, offer broad tunability of the wavelength spacing. This enables them to offer high resolution across a continuous slice of spectrum.

US Patent Publication number US2015/0259990, Plusquellic et al, discloses a technique known as "dual-comb spectroscopy". Plusquellic et al use the heterodyned beat signal of two combs, which have different wavelength spacings, to create an RF spectrum in the electrical domain. This simplifies the receiver and overcomes the need for an array spectrometer but results in a discrete rather than continuous spectral measurement.

US Patent Publication number US2007/0002327, Zhou et al, discloses a technique in which a comb laser is tuned across a spectral width in an interferometic arrangement. This provides continuous spectral coverage, but over a limited band, and with reduced resolution because only the interference fringes can be measured rather than the direct optical signal.

US Patent Publication number US2015/0323450, Lipson et al, discloses a technique in which an integrated ring resonator based comb laser is used for gas detection by thermally tuning the wavelength spacing. In this approach continuous tuning can be achieved over a limited range, and with thermally limited speed.

In order to broaden the spectral coverage of a spectrum analyser based on such high resolution, wavelength spacing tunable comb sources, it is possible to concatenate multiple comb sources together. However, in these types of combs, there exists a portion of the comb spectrum that does not tune, referred to here as a tuning "dead-zone". A problem with this approach is the dead-zone prevents continuous spectral coverage from being achieved.

Due to the dead-zone, continuous spectral coverage by concatenation of sources cannot be achieved by arranging the comb sources adjacently on either the higher frequency, or the lower frequency side of the dead-zone.

It is an object to provide a device for high resolution optical spectrum analysis based on optical combs and a method for high resolution optical spectrum analysis.

SUMMARY

The present invention is a new device and method for measuring optical spectrum signals, as set out in the appended claims.

In one embodiment there is provided a device comprising a first tunable comb laser source and a second tunable comb laser source whereby a wavelength of each comb laser source is chosen such that the combination of the two sources provide a continuous spectral coverage over a band in an optical spectrum under a selected tuning condition.

The invention is specifically for comb sources that have the ability to broadly tune the wavelength spacing. Comb sources that offer broad continuous tunability of the wavelength spacing have a tuning deadzone where the wavelength does not tune and where the source cannot be used as a continuous spectrum analyser. By overlapping the two comb sources in the manner described the deadzone issue is overcome in the most spectrally efficient way possible. This is achieved by using both sides of the comb spectrum around the dead-zone wavelength. This enables a continuous optical spectrum analyser to be built using optical combs that uses at least half as many devices compared to the other methods described to broaden the spectral coverage.

The invention uses a laser comb source to construct a new device for measuring optical spectrum signals that offers a new combination of resolution, cost, speed and robustness compared to existing solutions. Specifically, the invention uses a laser comb source to generate a number of narrow linewidth laser lines simultaneously; and some types of comb sources can be tuned at high speed to adjust the spectral position of the comb source laser lines. This provides the light source that can cover a continuous slice of the spectrum by tuning the comb line position at very high speeds, while also providing a higher spectral resolution than any existing high speed approaches using broad spectrum sources and arrays of photodiode receivers.

In one embodiment the device is configured for swept mode operation of the comb-spacing and the use of the two combs, each having identical wavelength spacing, to provide continuous spectral coverage. Direct detection is performed to achieve high resolution continuous spectral analysis.

In one embodiment the wavelength of each comb is a central wavelength and the output of each comb source is split into two bands using an optical splitter and at least one optical filter such that only a limited number of comb laser lines on either side of the central wavelength of either comb is present at an output.

In one embodiment the outputs of the combined comb lasers, optical splitters and optical filters are recombined using an optical coupler such that four bands of optical comb laser lines together operate as an output signal as if it were a single comb source with no gaps in the coverage of the optical spectrum band under tuning conditions.

In one embodiment the comb sources are tuned in such a manner as to ensure that the combination of individual comb source laser lines over a period of tuning completely cover the optical spectrum between the outermost edges of the outermost filters.

In one embodiment the combined output signal of the two laser comb sources after passing through a splitter, a filter and coupler are transmitted to a device under test in either reflection mode or in transmission mode to measure the optical spectral behaviour of the device under test.

In one embodiment the optical spectrum created by the dual laser comb source is split back into its original sets of laser comb lines using an optical filter.

In one embodiment each laser comb line that is output from the optical filter is coupled onto a photo diode and the light signal is converted into an electronic signal representing the amplitude of the light signal.

In one embodiment one or more comb sources where one of the comb laser lines in every comb source is split out from the others using an optical filter and that laser line is coupled into an optical referencing circuit to determine where that individual laser line is at any moment in time during tuning.

In one embodiment the laser line chosen for use as a reference is selected adjacent to the centre wavelength so that it is not reducing the total width of the spectrum that is covered by the two comb sources such that its wavelength range is covered by the other comb source.

In one embodiment the location of the individual comb laser line that has been split out from the others is used to infer the instantaneous location of all of the other laser lines in the comb source because of their coherent nature.

In one embodiment the optical referencing circuit consists of an optical reference device with a periodic spectral response whereby individual crossing points of the optical signal through the optical reference device can be measured using a photodiode after the optical reference device.

In one embodiment an optical referencing circuit comprises an optical reference device with a linear spectral response whereby individual crossing points of the optical signal through the optical reference device can be measured using a photodiode after the optical reference device.

In one embodiment the optical referencing circuit comprises an optical reference device with a spectral response whereby individual crossing points of the optical signal through the optical reference device can be measured using a photodiode after the optical reference device.

In one embodiment the optical referencing circuit consists of an optical reference device with a gas cell whereby the optical transmission through the gas can be measured using a photodiode after the optical reference device.

In one embodiment a wavelength of the comb laser source is chosen to provide a continuous spectral coverage over a band in an optical spectrum under a selected tuning condition.

In one embodiment the first and/or tunable comb laser source comprises a tunable gain switched comb laser source.

In one embodiment the first and/or tunable comb laser source selected from one or more of the following: mode-locked comb sources; electro-optical modulator based comb sources; and/or Kerr comb sources.

In a further embodiment there is provided a method of providing a continuous spectral coverage comprising the steps of:
configuring a first tunable comb laser source;
configuring a second tunable comb laser source;
selecting a wavelength of each comb laser source such that the combination of the two comb laser sources provide a continuous spectral coverage over a band in an optical spectrum under a selected tuning condition.

In one embodiment there is provided a device comprising a first tunable gain switched comb laser source and a second tunable gain switched comb laser source whereby a wavelength of each comb laser source is chosen such that the combination of the two sources provide a continuous spectral coverage over a band in an optical spectrum under a selected tuning condition.

DETAILED DESCRIPTION OF THE INVENTION

Figure 1:
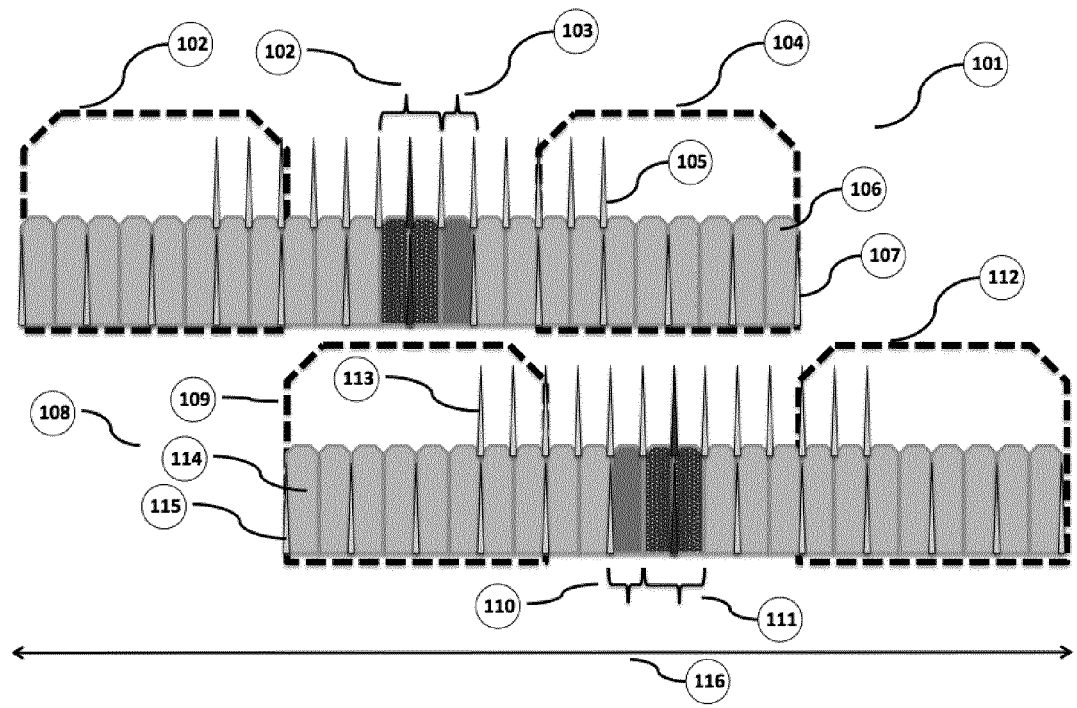
FIG. 1 is an optical spectrum view of the combined output spectrum of the transmit subsystem of the present invention.

The invention combines the spectral output of two laser comb sources in a specific manner as shown in FIG. 1 where the individual spectral characteristics of each single laser comb source are illustrated with one shown above [101] and the second one shown below [108]. Both laser comb sources are identical in all respects except for the central wavelength [102][111] of the combs which are offset from each other in order to ensure that a continuous slice of the optical spectrum [116] is covered by both laser comb source output spectrum when they are combined.

Referring now to the invention in more detail, in FIG. 1 there are two optical spectra output sets of laser lines [105][107] and [113][115] shown for each of the two comb sources. These two sets of lines represent the two extremes of the tuning range for each comb. Specifically, if the upper two sets of lines [105][107] are examined in detail, it is seen that there is a central laser line with a dead zone around it [102] which is typically of a laser comb source spectral output. When the comb source is tuned, this central laser line does not tune. However all of the lines to the left and to the right of the comb will tune and move outputs from position [105] to position [107].

There is a similar deadzone around the central wavelength [110] in the lower set of spectra [108] shown in FIG. 1. The lower set of spectra shows the second laser comb source tuning extremes between the initial position [113] and the final position [115].

Furthermore in reference to FIG. 1, there are four band pass optical filters shown [102][104][109][112] shown which are used to filter the combined output of the two laser comb source lines so that under tuning conditions, a continuous region of the optical spectrum is covered by the tuning of both comb sources. In other words, the laser lines produced by the upper comb source are filtered by [102] [104] so that they cover two regions with a gap in between. The gap is caused by the fact that the central wavelength is not tunable and there is a deadzone [102]. Likewise the lower laser comb source lines are filtered by [109] [112] so that they fill in the gaps in the upper spectra. Finally note that the dead zone [111] in the lower spectrum is now covered by the right hand set of laser lines from the upper comb source.

Referring to FIG. 1, there is also indicated a single laser line and its tuning zone [101] [110] in both the upper and lower spectra. This laser line is the reference line in both spectra and is used to provide a reference point for the other lines under tuning so that the device can retain an accurate knowledge of where all of the lasers lines under tuning conditions as they tune across the spectra. The two reference comb lines [103] [110] are diverted from the rest of the laser lines so that they can be transmitted into a reference circuit to measure their spectral position. As the reference lines are coherent with the other lines in the comb, this is a very efficient way to reference the exact spectral position of all of the other laser lines in the comb source output by constructing only one reference receiver circuit per comb source which provides accurate information about all comb source lines as if they were all being measured with their own individual reference receiver circuits.

Figure 4:
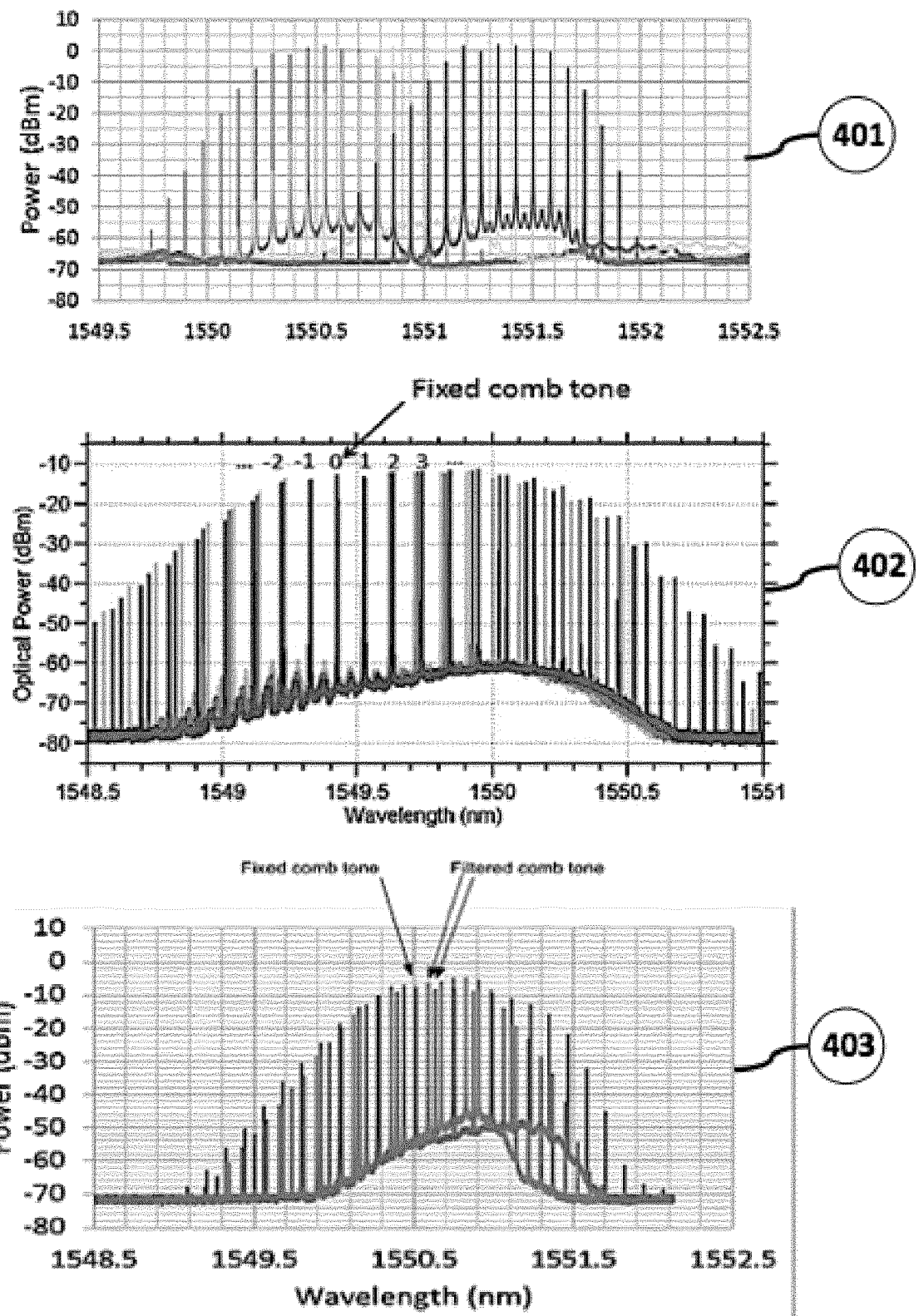
FIG. 4 is a set of examples of comb source optical spectra.
Figure 4:
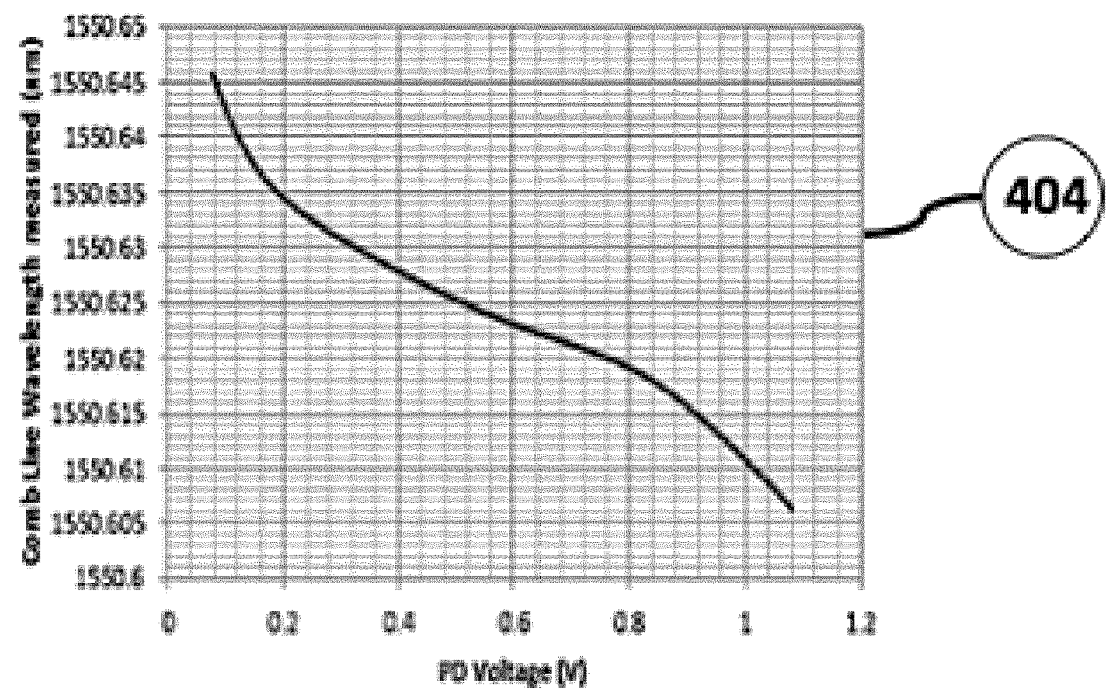
Figure 4:
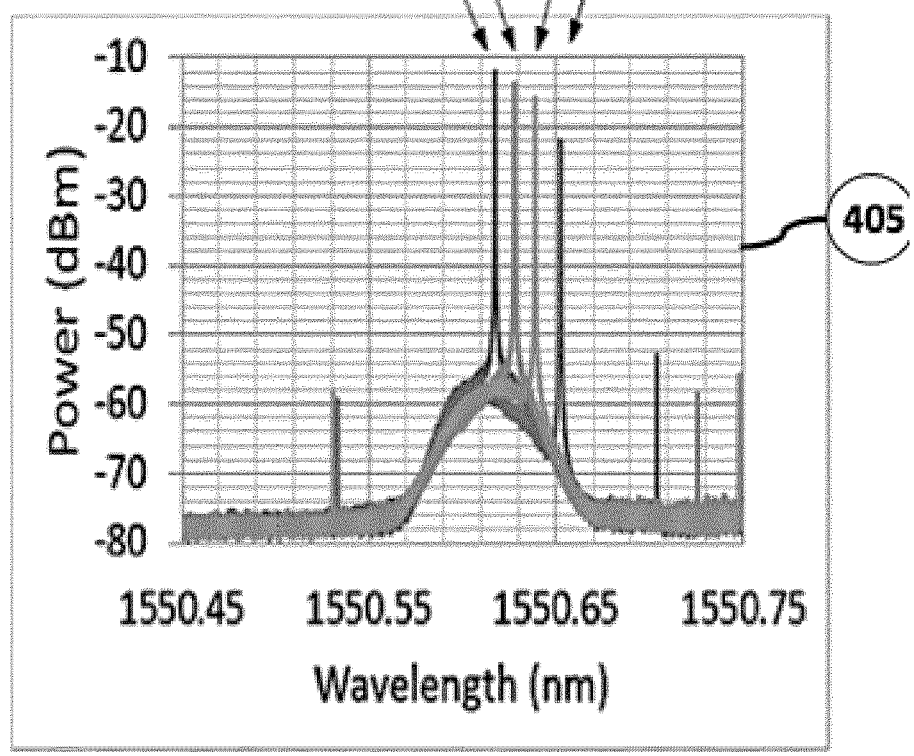

In reference to FIG. 4, examples of the real output spectra of the laser comb sources under tuning conditions can be seen. Specifically, a spectral output of a single laser comb source under temperature tuning is shown in [401]. Note that the entire comb can thus be positioned in the optical spectral position of interest by tuning the central wavelength of the single mode laser source such as a DFB (Distributed Feedback Bragg) laser diode.

In reference to FIG. 4, [402] shows how once the central wavelength has been set, the comb lines can then be tuned relative to the central wavelength by changing the input Radio Frequency (RF) signal being injected into the device. Two positions of the comb lines are shown in [402]. Furthermore in [403] a second example is shown of the tuning of a comb source that combines both tuning mechanisms, namely the temperature tuning of the central wavelength and the RF tuning of the comb lines themselves. By combining both tuning mechanisms, full flexibility of the choice of the spectral region that a single comb source covers can be achieved.

In reference to FIG. 4, on the right hand side [404] and [405] show the individual tuning characteristics of one of the comb lines that has been filtered out to produce this result. [404] shows the tuning wavelength of that single comb laser line under the tuning of the RF signal being injected into the laser which is typically how a laser comb line can be produced. [405] shows four examples of the instantaneous spectra of the comb focussed on one laser line under similar tuning conditions as shown in the tuning curve above [404].

Figure 5:
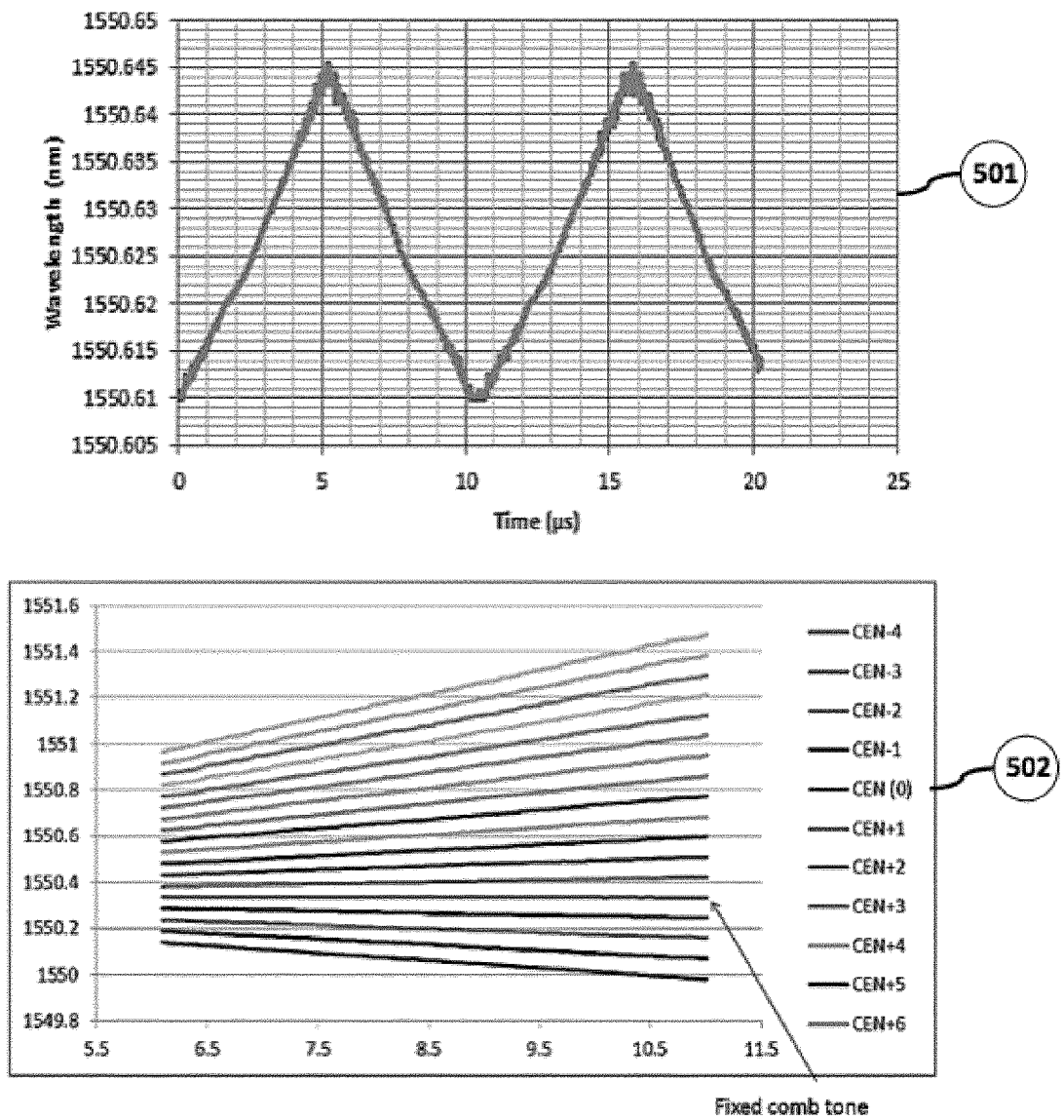
FIG. 5 is a set of examples of the tuning electrical input and the output of a comb source sunder tuning conditions.

For the purposes of this invention, and in reference to FIG. 5, the RF signal that is injected into the laser comb source is a saw-tooth waveform whereby the RF signal is varied between two values [501]. For example the RF signal could be varied between 10 GHz and 15 GHz. This would alter the Free Spectral Range (FSR), which is the spacing between individual laser lines of the comb source, from 10 GHz and 15 GHz, yielding 5 GHz of optical spectral tuning. The resulting tuning curves of all of the comb lines are shown in [502] where it should be noted that the tuning results in the fanning out of spectral coverage from the fixed central line and this enables the specific design of this invention to be created for continuous spectral coverage.

Figure 6:
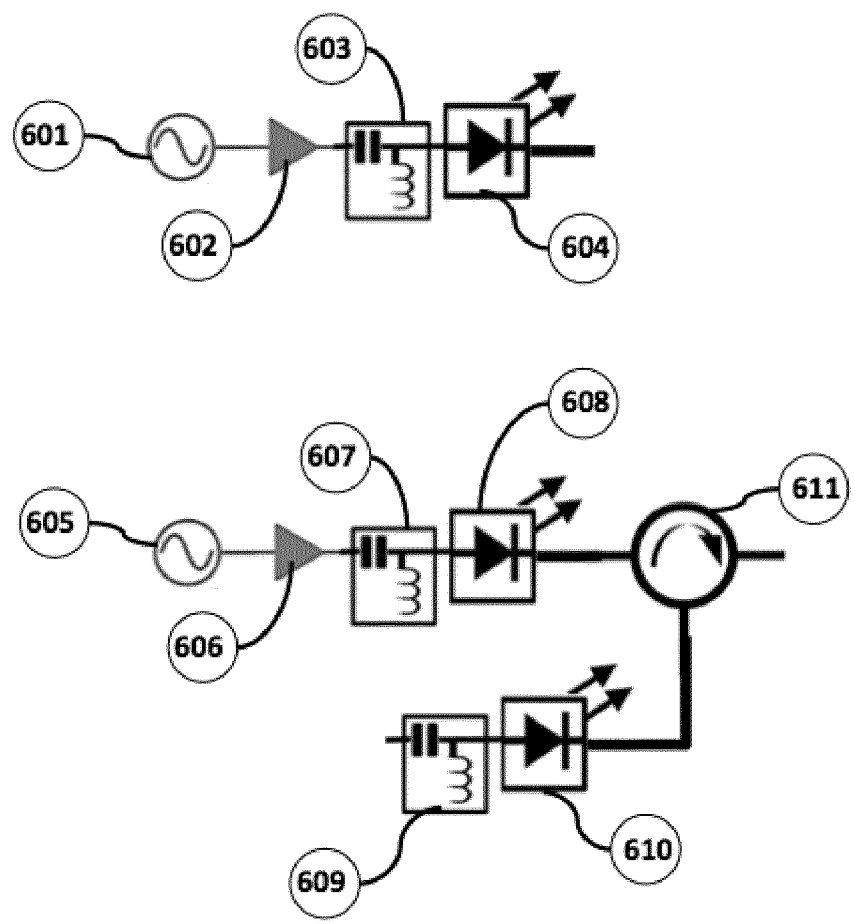
FIG. 6 is a set of circuit diagrams of comb source configurations.

The comb sources used in the device of this invention can be constructed in several ways which are illustrated in FIG. 6. Firstly the topmost configuration is the simplest way to build a comb source and it shows a single mode laser diode such as a DFB (Distributed Feedback Bragg) laser [604]. This is injected with a DC bias voltage through the bias tee shown [603], which also simultaneously couples an RF signal generated by the VCO (Voltage Controlled Oscillator) [601], which is passed through an amplifier [602] to boost the signal to sufficient power levels to create the comb source.

With reference to FIG. 6, in particular the lower diagram, there are multiple ways to produce a suitable laser comb spectra for use in the invention such as the addition of second laser [610] with a second bias tee [609] to deliver the driving voltage to the laser. This second laser can be a lower linewidth laser in order to reduce the individual linewidths of each of the laser comb source output lines and combine its output low linewidth laser line with the output of the laser [608] which could be for example a Fabry Perot laser. The advantage of this arrangement would be a wider tuning range as the combination of the Fabry Perot laser [608] and low linewidth laser [610] would produce more laser lines on the comb source through the injection locking of the Fabry Perot laser by the low linewidth laser. In this instance, the Fabry Perot laser is a slave laser and the low linewidth laser is a master or injection laser.

All optical components in FIG. 6 are pigtailed with Polarization Maintaining fibers to maintain the state of polarization. In particular, [611] is a polarization maintaining 3-port circulator device that allows the slave and master lasers to be combined through two input ports and output the combination through the third port. The use of polarization maintaining fiber and circulators removes the need of polarization controllers to align the polarization state of the injected light with the optical waveguide of the slave laser. This alignment is subjected to environmental variations such as temperature, mechanical vibrations, pressure, etc. which could cause instabilities, and ultimately reduce the relative accuracy of the measure spectrum. The external injection offers beneficial properties such as an improvement in the number of comb tones, spectral flatness and an effective transference of the narrow linewidth of the master laser to the slave comb lines.

Furthermore, in reference to FIG. 6, the master or injection laser could also be implemented as a widely tunable single frequency laser, such as the Sample Grating Distributed Bragg Reflector laser (SGDBR) or similar widely tunable lasers such as External Cavity Lasers (ECL), whereby the central wavelength of the comb can be changed by tuning the master laser to a different wavelength.

The invention allows the use of comb lasers that can be tuned using the RF signal from a Voltage Controlled Oscillator (VCO), and this has the advantage that the tuning can be achieved at speeds of hundreds of kilohertz up to tens of megahertz using the tuning speed of the sawtooth waveform that the VCO generates. This in turn tunes the comb lines so that they cover their individual segments of the spectrum in hundreds of kilohertz up to tens of megahertz speeds.

Figure 2:
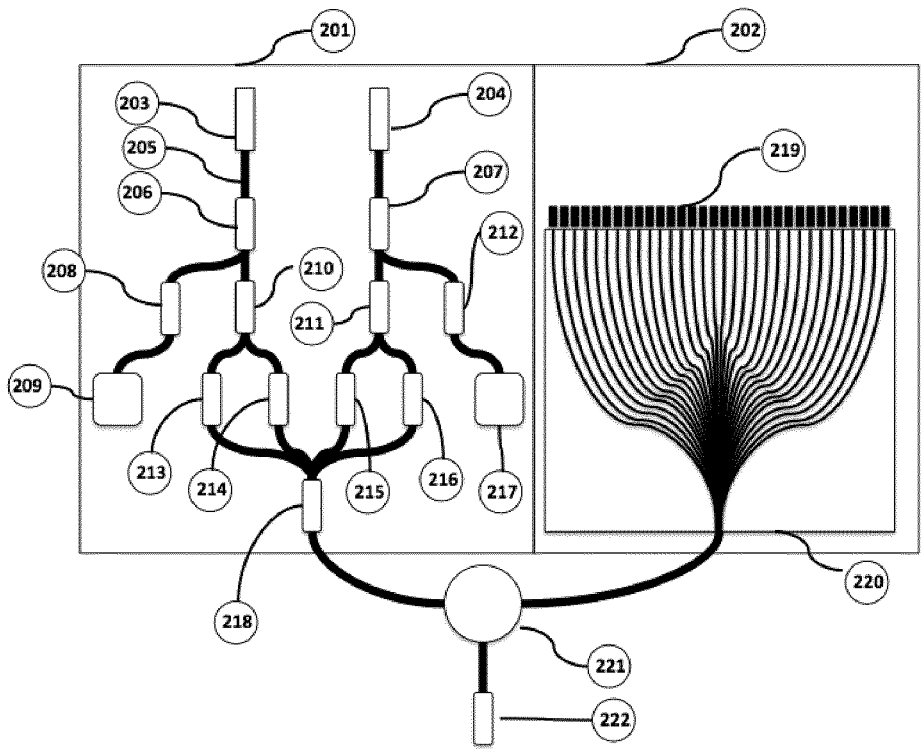
FIG. 2 is an optical circuit view of the optical subsystem of the present invention.

Given that there are a number of ways to create a suitable comb source, and create a comb source that is also tunable, and a comb source that is tunable at high speed, the device of this invention can then be described in more detail in reference to FIG. 2, where two such comb sources are combined in an optical transmit circuit [201] and an optical receive circuit [202] to form the optical subsystem of the invention.

EXAMPLE EMBODIMENTS

FIG. 2 illustrates an embodiment of the invention which is a device that consists of an optical transmit circuit [201] and an optical receive circuit [203]. These two subsystems are connected to an optical 3-port circulator [221]. The optical circulator [221] allows a Device Under Test (DUT) [222] to be connected to the system. The DUT can be an optical sensor, or an optical component that has a particular reflection spectrum that is desired to be analysed, or any type of optical component whose reflection spectrum is desired. Although not illustrated here, it is possible to connect a device directly to the transmit and receive output ports without the use of the circulator and measure the transmitted spectrum rather than the received spectrum.

With further reference to FIG. 2, the optical transmit subsystem [201] consists of two laser comb sources [203] [204], each of which has an almost identical optical processing circuit immediately following below the device itself as shown. For example, components [203][205][206] [208][210][209][213][214] are identical to the sequence of components [204][207][211][212][215][216][217]. These two sequences of components are then connected together through an optical combiner or coupler [218]. Note that although the components that follow both comb sources are essentially identical, each set will be tailored to work at the required spectral wavelengths that are appropriate for the individual comb source [203] or [204]. It will be appreciated that the comb sources can be selected from one or more of the following, gain switch comb source, mode-locked comb sources, and electro-optical modulator based comb sources, and Kerr comb sources.

The components shown in the transmit subsystem [201] can be either discrete individual components connected together with fiber optic cables or they can be components that are integrated onto a common substrate with optical waveguides used to interconnect them. As shown this interconnection is illustrated by [205].

Starting with a single comb source [203], the light is emitted into waveguide [205] and into an optical splitter [206]. This splitter sends a small amount (e.g. 10%) of the light into one waveguide and through a bandpass filter [208] where the reference comb line (FIG. 1 [110]) is filtered out and transmitted through into a reference optical circuit [209].

The reference optical circuit [209] is any optical filter device or devices which converts wavelength into power measurements. For example, any regular Fabry Perot etalon with a periodic optical response could be used as the reference circuit, whereby a photodiode measures the light through the Fabry Perot etalon and an electrical circuit sends a latch signal when the light reaches a pre-determined cross-over point on the up or down slope of the periodic etalon signal. This is typically done in telecoms systems to actively lock a wavelength to a wavelength locker constructed from a Fabry Perot etalon. Note that in general the reference circuit my also contain a straightforward photodiode power measurement which is then divided out of the wavelength measurement to normalise the signal.

The reference optical circuit [209] could also be any wavelength dependent filter with a sloped curve response to relate wavelength to power. The reference optical circuit could also be a periodic filter such as an interferometric solution, for example a mach zehnder interferometer. Or the reference optical circuit could also be any combination of such filters. Or the reference optical circuit could also be a gas reference cell combined with any such filters.

The purpose of the reference optical circuit is to allow the system to measure the exact time that the reference comb line crosses a particular wavelength under tuning conditions. Given that the tuning mechanism of the comb line is the injection of a single saw tooth waveform which has been characterised for that device, if this characterisation is then combined with the position given from the reference filter, the system can then easily calculate the exact wavelength position of all comb lines over a period of time. In other words, the position of the reference comb line is implicitly linked to the position of all other comb lines as they are all coherent with each other having been generated from the same slave laser.

The splitter [206] sends a small percentage (e.g. 10%) of the light to the reference circuit and sends the majority of the light (e.g. 90%) of the light to a combination of filters [210][213][214][218] before the light signals then arrive at the circulator [221] and on out to the Device Under Test (DUT) [222]. The purpose of this combination of filters it to filter out the group of comb lines on either side of the static central comb line so that the chosen comb lines do not overlap with the chosen comb lines of the other comb source in the system.

The majority of the light output from the comb lines is filtered by first splitting it into two equal components using a 50%-50% splitter [210]. Then two band pass filters [213] [214] are used to select two groups of comb lines, one on either side of the static central comb line as shown in FIG. 1. Once the lines have been selected, the two groups are then recombined in an optical coupler [218].

A similar process for the second comb source [204] is followed to copy the process for the first comb source [203]. For the second comb source [204], the light output is first split into two copies using a splitter [207], a small amount (e.g. 10%) being sent into a reference optical circuit, first passing through a band pass filter [212] to select out the single reference comb line, then an identical reference optical circuit [217] to the first reference optical circuit [209] is used to determine in exactly the same way the exact timing of the location of the reference comb line under tuning conditions.

For the second comb source [204], the majority of the light is split off (e.g. 90%) by the splitter [207] and sent into a combination of filters [211][215][216][218]. The light is split into two equal parts using a 50%-50% splitter [211], then two separate groups of comb lines are filtered out using two band pass filters [215][216], before the light is recombined with the comb lines from the first comb source at the coupler [218].

Therefore a total of four groups of comb lines, two from each of the two comb sources are combined in the coupler [218] and transmitted through the circulator [221] to arrive at the Device Under Test (DUT) [222]. The light is then reflected by the DUT back into the circulator and passed through the third port of the circulator and into the receiver optical circuit [202].

The receiver unit [202] consists of an Arrayed Waveguide (AWG) [220] and an array of photodiodes [219]. This receiver unit receives the reflected light which consists of all of the combined four sets of comb lines, and the receiver uses the AWG to split the light into its individual comb lines. Each comb line passes through the AWG and arrives uniquely at a single photodiode. The photodiode measures the amplitude of the light signal at high speed as it tunes, providing a spectrum of data for that individual comb source.

Figure 3:
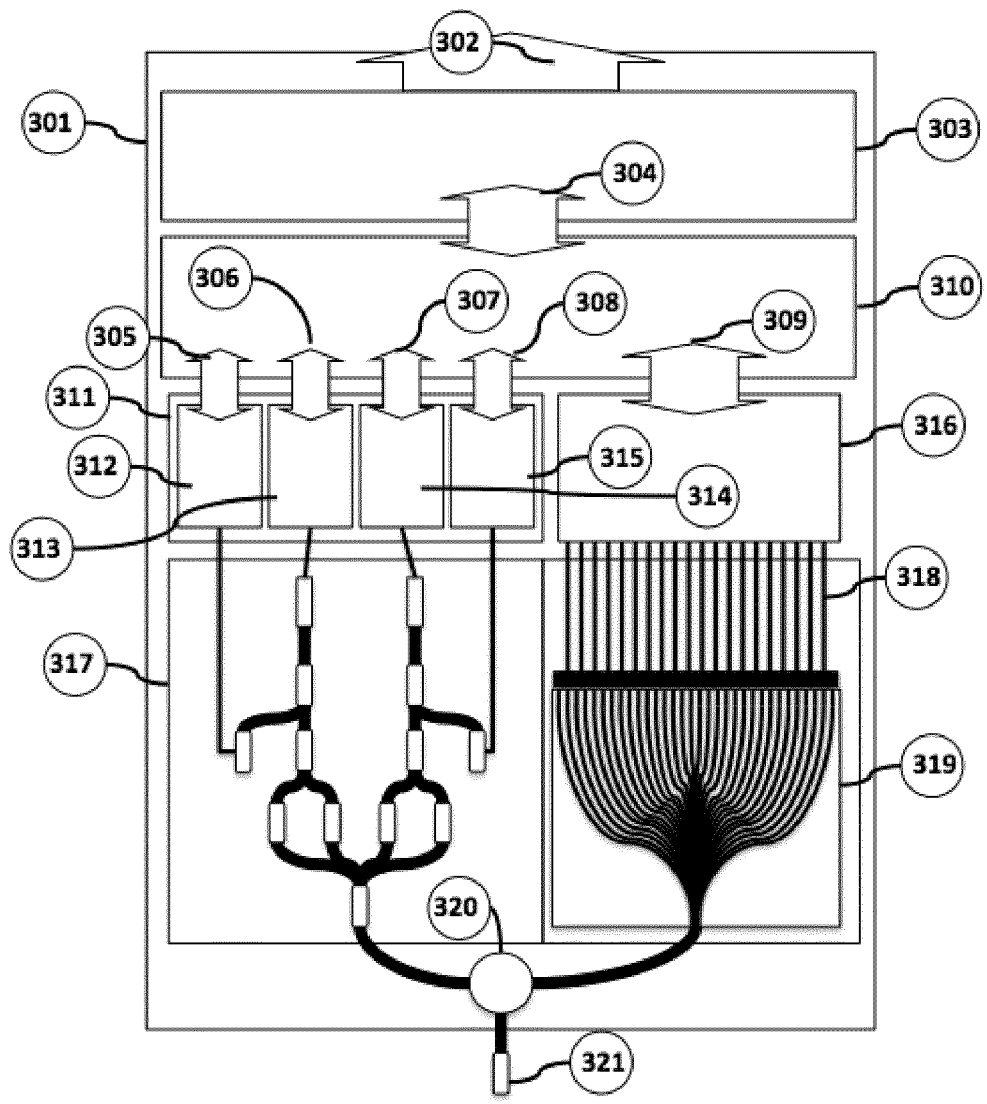
FIG. 3 is a system block view of the present invention.

The optical circuits shown in FIG. 3 require additional electronics and signal processing in order to produce a final reference spectrum set of data as an output. In FIG. 4, this additional set of electronics and processing blocks is shown where by the optical circuits of FIG. 3 are incorporated into a larger system. The aim of the overall system shown in FIG. 3 is to output an optical spectrum [302] which gives the amplitude of the reflected signal from the Device Under Test (DUT) [321] across the full tuning range of the combined output of the comb sources in the form of a set of data pairs consisting of wavelength and amplitude measurements that have been calculated.

The system [301] shown in FIG. 4 consists therefore of the optical circuits [317] shown in FIG. 3 combined with the circulator [320] and DUT [321] on the front-end output side, and a set of transmit electronics [311], receive electronics [316], data processing electronics [310] and a block of processing software [303].

The system [301] also has a series of internal interfaces [305][306][307][308][309][304] for passing data up and down through the blocks of the system.

The first block of electronics [312] is for driving the photodiodes within the optical reference circuit for the first comb source. It provides the electrical power for the photodiode, it also provides the receiver circuit with any amplification, analog to digital conversion and a digital output of the value measured at each of the photodiodes.

The second block of electronics [313] is for driving the first comb source in the system. It consists of the DC bias supply, the bias tee, the RF driver circuitry with a Voltage Controlled Oscillator (VCO) for driving the comb source, or whatever normal drive circuitry is required to tune and power the comb source. The third block of electronics [314] does exactly the same set of functions for the second comb source in the system.

The fourth block of electronics [315] is an exact copy of the first block [312] and drives the photodiodes within the optical reference circuit for the second comb source.

The fifth block of electronics [316] consists of the set of drivers and receive circuitry for the array of photodiodes that receive the reflected signals through the AWG. Note that there is a set of parallel electrical connections between the photodiode array and the electronics so that the analog to digital processing of the received measurements is done in parallel for speed reasons.

A sixth block of electronics [310], combines the received signals from the AWG with the reference signals from the optical reference circuits in order to compute a referenced optical spectrum for example that might be spaced equally in terms of wavelength steps while also spaced equally in terms of time samples used.

The final block in FIG. 4 is a software function that is used to convert the data received from the electronics blocks into a presentable format by adding timestamps and units to the data so that it can be viewed through the interface [302] in human readable form.

Typically each of the systems shown in FIG. 4 would cover 3-4 nm of the optical spectrum, by combining two comb sources in the manner described, as the comb sources might typically cover 1.5-2 nm regions each. Therefore multiple such units could be combined to cover a wider range of the spectrum. This combined unit is not illustrated but would simply replicate many of the units shown in FIG. 4. In this instance, it would be a standard operation to add a final optical coupler to combine the outputs of multiple units before the DUT, while then also adding a set of filters to split the received light back into its 3-4 nm regions of interest for each individual unit.

On the electronics processing side, the digital output of each unit could be easily combined within a final processing unit, either in hardware or software, to add together the 3-4 nm slices of measured data in order to construct a wider coverage of the spectrum.

A potential way of combining the units shown in FIG. 4 would be to select units that are set to work at various 3-4 nm areas of the spectrum but that are not adjacent to each other on the spectrum. This would be particularly useful if the system is being used for gas detection between 1200 nm and 1600 nm where the gas lines themselves are measured by using a gas cell as the DUT. In this instance, it is desirable only to measure the areas of the spectrum where the gas lines are expected to be, which is well tabulated and known in the industry. This means that a unique and multi-species gas detection unit could be constructed from such units as shown in FIG. 4 so that only the areas of interest are being measured in the spectrum, optimising the cost of the unit.

The unit shown in FIG. 4 could also be constructed by placing the optical circuits and the electronic circuits into a Photonics Integrated Circuit (PIC), combined with an ASIC (Application Specific Integrated Circuit) or an FGPA (Field Programmable Gate Array) device. It might also be possible to place multiple such units into a single PIC, ASIC or FPGA combination, dramatically reducing the size, weight, power and cost of a spectrum analyser than can analyse large areas of the spectrum for applications such as multi-species gas detection.

A single unit as shown in FIG. 4 could be used to measure a single Fiber Bragg Grating (FBG) optical sensor device, which are typically 0.3 nm in width, but can shift under compression or strain on the fiber over the 3-4 nm region in question. Therefore combinations of multiple such units could be used to measure multiple FBG devices on the same fiber which combined would become the Device Under Test (DUT) described in the invention.

The DUT could also be any other type of optical sensor unit and the invention is then being applied as an optical sensor interrogator that is measuring the optical spectrum of the reflected or transmitted signal of the optical sensor and using the electronics and software processing blocks to present the returned data in a manner more suitable to a sensor unit output. For example, the processing blocks (either software or hardware) could search and find the peaks of the received spectrum and translate those using transducer equations into real measurements taken by the optical sensors themselves.

The device in FIGS. 3 and 4 can cover an area of the spectrum typically 3-4 nm with current state of the art technology in comb sources. The tuning mechanism is an electrical variation of the RF frequency of the output of a Voltage Controlled Oscillator. Therefore the tuning speed of the device can be as high as hundreds of kilohertz and even tens of megahertz given the state of the art currently. The speed of tuning is only limited by the speed of the tuning electronics, as the response time of the laser systems itself in generating the comb is of the order of five nanoseconds or less. Therefore the device is suitable for measuring the audio frequency response of an optical sensor which makes it suitable for use in seismic measurement systems. The system shown in FIG. 4 could measure at very high speeds while maintaining a high spectral resolution figure because it is still essentially composed of parallel sets of optical comb lines, each of which is a low linewidth, single mode laser output line. The laser output line effectively acts as a high resolution tunable filter for measuring the optical spectral response of the received optical spectrum. The high speed is also achieved by the parallel processing of all of the individual laser comb lines entering the receiver unit of the system.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a memory stick or hard disk. The carrier may be an electrical or optical signal which may be transmitted via an electrical or an optical cable or by radio or other means.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A device comprising:
a first tunable comb laser source and
a second tunable comb laser source,
whereby the wavelength of each comb laser source is chosen such that the combination of the two sources provides a continuous spectral coverage over a band in an optical spectrum under a selected wavelength tuning condition,
wherein the wavelength of each comb is a fixed wavelength and the output of each comb source is split into two bands using an optical splitter and at least one optical filter such that only a limited number of comb laser lines on either side of the central wavelength of either comb is present at an output,
wherein the output of the combined comb lasers, the optical splitter and the optical filter for each laser source are recombined using an optical coupler such that four bands of optical comb laser lines together operate as an output signal as a single comb source with no gaps in the coverage of the optical spectrum band under a selected tuning condition.

2. The device as claimed in claim 1 wherein the comb sources are tuned in to ensure that the combination of individual comb source laser lines over a period of tuning completely cover the optical spectrum between the outermost edges of at least one filter.

3. The device as claimed in claim 1 wherein the combined output signal of the two laser comb sources after passing through a splitter, a filter and coupler are transmitted to a device under test in either reflection mode or in transmission mode and configured to measure the optical spectral behaviour of the device under test.

4. The device as claimed in claim 1 wherein the optical spectrum created by the laser comb sources is split back into its original sets of laser comb lines using an optical filter.

5. The device as claimed in claim 4 wherein each laser comb line that is output from the optical filter is coupled onto a photo diode and the light signal is converted into an electronic signal representing the amplitude of the light signal.

6. The device as claimed in claim 1 wherein at least one comb laser lines in each comb source is split out from the others using an optical filter and that laser line is coupled into an optical referencing circuit to determine where that individual laser line is at any point in time during tuning.

7. The device as claimed in claim 1 whereby a laser line chosen for use as a reference is selected adjacent to the centre wavelength so that it is not reducing the total width of the spectrum that is covered by the two comb sources such that its wavelength range is covered by the other comb source.

8. The device as claimed in claim 1 whereby the location of the individual comb laser line that has been split out from the others is used to infer the instantaneous location of all of the other laser lines in the comb source.

9. The device as claimed in claim 1 whereby an optical referencing circuit comprises an optical reference device with a periodic spectral response whereby individual crossing points of the optical signal through the optical reference device are measured using a photodiode after the optical reference device.

10. The device as claimed in claim 1 wherein an optical referencing circuit comprises an optical reference device with a linear spectral response whereby individual crossing points of the optical signal through the optical reference device are measured using a photodiode after the optical reference device.

11. The device as claimed in claim 1 whereby an optical referencing circuit comprises an optical reference device with a spectral response whereby individual crossing points of the optical signal through the optical reference device are measured using a photodiode after the optical reference device.

12. The device as claimed in claim 1 whereby an optical referencing circuit comprises an optical reference device with a gas cell whereby the optical transmission through the gas are measured using a photodiode after the optical reference device.

13. The device as claimed in claim 1 wherein the first and/or second tunable comb laser source comprises a tunable gain switched comb laser source.

14. The device as claimed in claim 1 wherein the first and/or second tunable comb laser source is selected from one or more of the following: mode-locked comb sources; electro-optical modulator based comb sources; and/or Kerr comb sources.

* * * * *